US012307121B2

(12) United States Patent
Nguyen et al.

(10) Patent No.: US 12,307,121 B2
(45) Date of Patent: May 20, 2025

(54) FILTERING METRICS ASSOCIATED WITH MEMORY

(71) Applicant: Micron Technology, Inc., Boise, ID (US)

(72) Inventors: Dung Viet Nguyen, San Jose, CA (US); Shantilal Rayshi Doru, San Diego, CA (US); Jun Wan, San Jose, CA (US); Sampath Ratnam, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 167 days.

(21) Appl. No.: 17/823,625

(22) Filed: Aug. 31, 2022

(65) Prior Publication Data
US 2024/0069788 A1    Feb. 29, 2024

(51) Int. Cl.
 G06F 3/06    (2006.01)
(52) U.S. Cl.
 CPC .......... G06F 3/0655 (2013.01); G06F 3/0604 (2013.01); G06F 3/0679 (2013.01)
(58) Field of Classification Search
 CPC ..... G06F 3/0655; G06F 3/0604; G06F 3/0679
 USPC .................................. 711/154, 100, 12.001
 See application file for complete search history.

(56) References Cited

U.S. PATENT DOCUMENTS

| | | | | |
|---|---|---|---|---|
| 7,865,006 B2* | 1/2011 | Hsieh | ........................ | G06T 5/70 |
| | | | | 345/418 |
| 8,411,510 B2* | 4/2013 | Son | ..................... | G11C 11/5628 |
| | | | | 365/185.24 |
| 2010/0313270 A1* | 12/2010 | Kim | .................. | H04W 52/0264 |
| | | | | 726/24 |
| 2016/0179394 A1* | 6/2016 | Iyer | ........................ | G06F 3/0629 |
| | | | | 711/117 |
| 2018/0293029 A1* | 10/2018 | Achtenberg | ......... | G11C 29/028 |
| 2020/0293228 A1* | 9/2020 | Amaki | .................. | G06F 3/0604 |
| 2021/0405909 A1* | 12/2021 | Ema | ........................ | G06F 16/14 |

* cited by examiner

*Primary Examiner* — Gautam Sain
*Assistant Examiner* — Edward Waddy, Jr.
(74) *Attorney, Agent, or Firm* — Harrity & Harrity, LLP

(57) ABSTRACT

In some implementations, a controller of a memory device may obtain a first metric associated with a memory of the memory device using a first memory read configuration. The controller may apply a function to the first metric to obtain a second memory read configuration. The controller may obtain a second metric associated with the memory using the second memory read configuration. The controller may filter the first metric and the second metric to obtain a first filtered metric and a second filtered metric. The controller may provide the first filtered metric and the second filtered metric to a memory management process executing on the controller. The controller may perform an action based on an output of the memory management process, wherein the output is based on the first filtered metric and the second filtered metric.

25 Claims, 12 Drawing Sheets

FILTERING METRICS ASSOCIATED WITH MEMORY

TECHNICAL FIELD

The present disclosure generally relates to memory devices, memory device operations, and, for example, to filtering metrics associated with memory.

BACKGROUND

A non-volatile memory device, such as a NAND memory device, may use circuitry to enable electrically programming, erasing, and storing of data even when a power source is not supplied. Non-volatile memory devices may be used in various types of electronic devices, such as computers, mobile phones, or automobile computing systems, among other examples.

A non-volatile memory device may include an array of memory cells, a page buffer, and a column decoder. In addition, the non-volatile memory device may include a control logic unit (e.g., a controller), a row decoder, or an address buffer, among other examples. The memory cell array may include memory cell strings connected to bit lines, which are extended in a column direction.

A memory cell, which may be referred to as a "cell" or a "data cell," of a non-volatile memory device may include a current path formed between a source and a drain on a semiconductor substrate. The memory cell may further include a floating gate and a control gate formed between insulating layers on the semiconductor substrate. A programming operation (sometimes called a write operation) of the memory cell is generally accomplished by grounding the source and the drain areas of the memory cell and the semiconductor substrate of a bulk area, and applying a high positive voltage, which may be referred to as a "program voltage," a "programming power voltage," or "VPP," to a control gate to generate Fowler-Nordheim tunneling (referred to as "F-N tunneling") between a floating gate and the semiconductor substrate. When F-N tunneling is occurring, electrons of the bulk area are accumulated on the floating gate by an electric field of VPP applied to the control gate to increase a threshold voltage of the memory cell.

An erasing operation of the memory cell is concurrently performed in units of sectors sharing the bulk area (referred to as "blocks"), by applying a high negative voltage, which may be referred to as an "erase voltage" or "Vera," to the control gate and a configured voltage to the bulk area to generate the F-N tunneling. In this case, electrons accumulated on the floating gate are discharged into the source area, so that the memory cells have an erasing threshold voltage distribution.

Each memory cell string may have a plurality of floating gate type memory cells serially connected to each other. Access lines (sometimes called "word lines") are extended in a row direction, and a control gate of each memory cell is connected to a corresponding access line. A non-volatile memory device may include a plurality of page buffers connected between the bit lines and the column decoder. The column decoder is connected between the page buffer and data lines.

DETAILED DESCRIPTION

Figure 1:
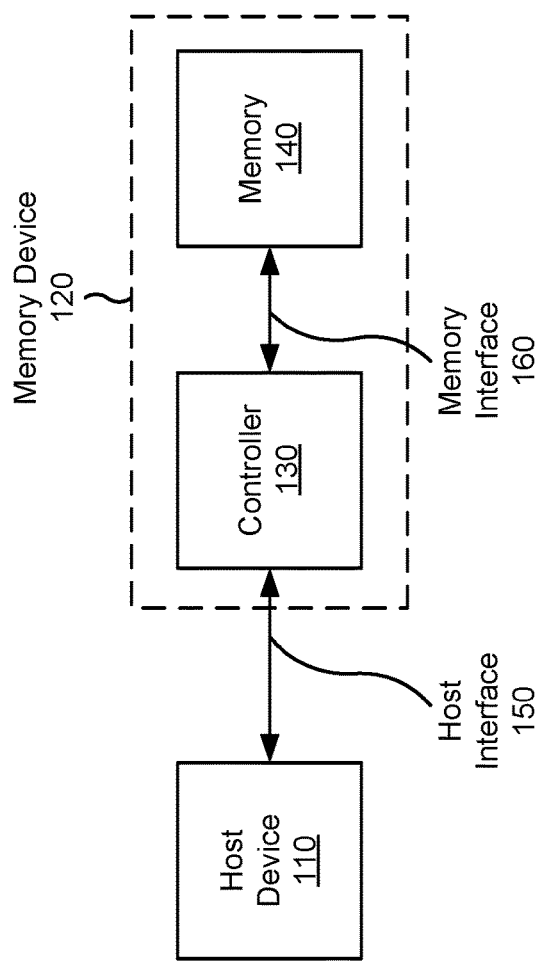
FIG. 1 is a diagram illustrating an example system capable of filtering metrics associated with memory.

A controller of a memory device may employ a memory management process (e.g., a media management algorithm) to evaluate a reliability of the memory device. The memory device may include memory, such as non-volatile memory (e.g., NAND flash memory). The memory management process may rely on an iterative process of obtaining metrics (or measurements) that reflect characteristics of the memory. The characteristics may relate to whether the memory provides reliability for read-write functions. As an example, a first step of a memory management process may involve the controller obtaining a first metric (or first measurement) of the memory using a first memory read configuration (or first memory read parameters). The controller may obtain the first metric by performing a first non-volatile memory read/write operation based on the first memory read configuration. In other words, the controller may observe characteristics of the memory that result from performing the first non-volatile memory read/write operation. A second step of the memory management process may involve the controller applying a function to the first metric and determining a second memory read configuration (or second memory read parameters) based on the function applied to the second metric. A third step of the memory management process may involve the controller obtaining a second metric (or second measurement) of the memory using the second memory read configuration. The controller may obtain the second metric by performing a second non-volatile memory read/write operation based on the second memory read configuration. In other words, the controller may observe characteristics of the memory that result from performing the second non-volatile memory read/write operation. The controller may obtain additional metrics associated with the memory using additional memory read configurations until a desired outcome is achieved.

The controller may execute the memory management process to ensure a reliability of the memory with respect to read-write operations. The memory management process may indicate whether data written to memory is correctly read from the memory. In other words, the memory management process may be useful for determining whether data read from the memory is the same data that was previously written to the memory. For example, when the controller writes a value of "1" to memory, the controller should read back that same value of "1" from the memory at a later time. When the controller reads back a "0" from the memory instead of the "1", an error may occur. As another example, when the controller writes a value of "0" to memory, the controller should read back that same value of "0" from the memory at a later time. When the controller reads back a "1" from the memory instead of the "0", an error may result. The memory management process may continuously run to ensure the reliability of the memory (e.g., to ensure that the data is reliably written to the memory and read from the memory).

The controller, via the memory management process, may be able to detect a problem associated with the memory based on metrics obtained using various memory read configurations. As an example, the controller may detect when a particular page of memory is associated with a quantity of read-write errors that satisfies a threshold. The controller may detect that the page of memory is associated with the quantity of read-write errors based on metrics obtained for the page of memory. As another example, the controller may detect when a read level (e.g., a voltage level associated with a read operation) results in a quantity of read-write errors that satisfies a threshold. The controller may detect that the read level results in the quantity of read-write errors based on metrics obtained for the memory. The memory management process may provide an output, based on metrics associated with the memory, that indicates a reliability issue related to the memory.

The controller, based on the output from the memory management process, may perform an action to mitigate the problem associated with the memory. The action may depend on a type of problem detected for the memory. As an example, when the particular page of memory is associated with the quantity of read-write errors that satisfies the threshold, the controller may turn off or deactivate that particular page of memory and existing data stored on that particular page of memory may be moved to another region in the memory. As another example, when the read level results in the quantity of read-write errors that satisfies the threshold, the controller may adjust the read level to a new read level, where the new read level may be less likely to result in read-write errors.

One problem with the memory management process is that the memory management process may be subjected to noise (or different sources of metric variation or measurement variation). The noise may result because the metrics are typically obtained by performing non-volatile memory read-write operations. A value of a metric may change from one instance to another instance, even when a same memory read configuration is used. The noise may be due to an inherent variation of metrics of the memory. For example, the controller may obtain a metric using a particular memory read configuration, and at a later time, the controller may obtain a different metric using the same memory read configuration. In other words, obtaining metrics several times using the same memory read configuration may result in different metrics, even though the metrics should theoretically be the same since the same memory read configuration is being used each time. These different metrics may be referred to as metric-to-metric variation, read-to-read variation, or measurement-to-measurement variation, which may occur across the same memory read configuration.

Such variation may negatively impact an effectiveness of the memory management process. The controller may obtain, via the memory management process, a particular metric, and an output of the memory management process may be based on that particular metric. Thus, the action performed by the controller may be based on that particular metric. However, due to metric-to-metric variation caused by noise, that particular metric may not necessarily be accurate, and in some cases, an action may be performed that is not reflective of a true metric associated with the memory. In other words, when making a decision (e.g., adjusting a read level or shutting down a page) is based on only one observation, there is a risk that noise negatively affected that observation, thereby potentially causing the decision to be incorrect.

As a specific example, a memory management process may use cell count values, which correspond to counts of non-conducting cells, to search for optimal read positions. The memory management process that uses the cell count values to search for the optimal read positions may become stuck in local minima in the presence of large read-to-read variation, which may result in a decision (e.g., a calibration of a read level) that is potentially incorrect.

To solve the problems described above, as well as to reduce a metric variation (or measurement variation) in a memory management process for a non-volatile memory, a technical solution is described herein for employing a low pass filter to mitigate the metric variation in the memory management process for the non-volatile memory. A memory device may include memory and a controller. The controller may obtain a metric associated with the memory using a memory read configuration. The controller may filter, using the low pass filter, the metric associated with the memory to obtain a filtered metric. The filtered metric may be associated with less noise as compared to the metric (e.g., an unfiltered metric). The controller may evaluate, using the memory management process, a read-write reliability of the memory based on the filtered metric. The controller may determine, based on an output of the memory management process, whether the read-write reliability of the memory satisfies a threshold. When the controller determines that the read-write reliability of the memory satisfies the threshold, no action may be taken. When the controller determines that the read-write reliability of the memory does not satisfy the threshold, the controller may perform an action to improve the read-write reliability of the memory (e.g., adjust a read level of turn off a particular page of memory). By applying the low pass filter to the metric obtained for characterizing the memory, noise or variation associated with the metric may be removed or reduced, and as a result, the action taken as a result of the metric may be a true reflection of the characteristics of the memory.

As an example, when the output of the memory management process is based on the filtered metric as opposed to an unfiltered metric, the controller may not adjust the read level when the read level does not need to be adjusted, nor may the controller turn off the particular page of memory when that particular page of memory is actually operating correctly. The controller may filter metrics using the low pass filter (or multiple low pass filters) to reduce a likelihood of incorrect decision making, thereby improving an operation of the memory device.

FIG. 1 is a diagram illustrating an example system 100 capable of filtering metrics associated with memory. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the controller 130 may obtain a metric associated with the memory 140 using a memory read configuration. The controller 130 may filter, using a low pass filter, the metric associated with the memory 140 to obtain a filtered metric. The controller 130 may evaluate, using a memory management process, a read-write reliability of the memory 140 based on the filtered metric.

In some implementations, the controller 130 may obtain a first metric associated with a memory 140 of the memory device 120 using a first memory read configuration. The controller 130 may apply a function to the first metric to obtain a second memory read configuration. The controller 130 may obtain a second metric associated with the memory 140 using the second memory read configuration. The controller 130 may filter, using a filter function, the first metric and the second metric to obtain a first filtered metric and a second filtered metric. The controller 130 may provide the first filtered metric and the second filtered metric to a memory management process executing on the controller 130. The controller 130 may perform an action based on an output of the memory management process, wherein the output is based on the first filtered metric and the second filtered metric.

In some implementations, the controller 130 may obtain a metric associated with a memory 140 using a memory read configuration. The controller 130 may filter, using a low pass filter, the metric associated with the memory 140 to obtain a filtered metric. The controller 130 may provide the filtered metric to a memory management process. The controller 130 may perform an action based on an output of the memory management process, wherein the output is based on the filtered metric.

As indicated above, FIG. 1 is provided as an example. Other examples may differ from what is described with regard to FIG. 1.

Figure 2:
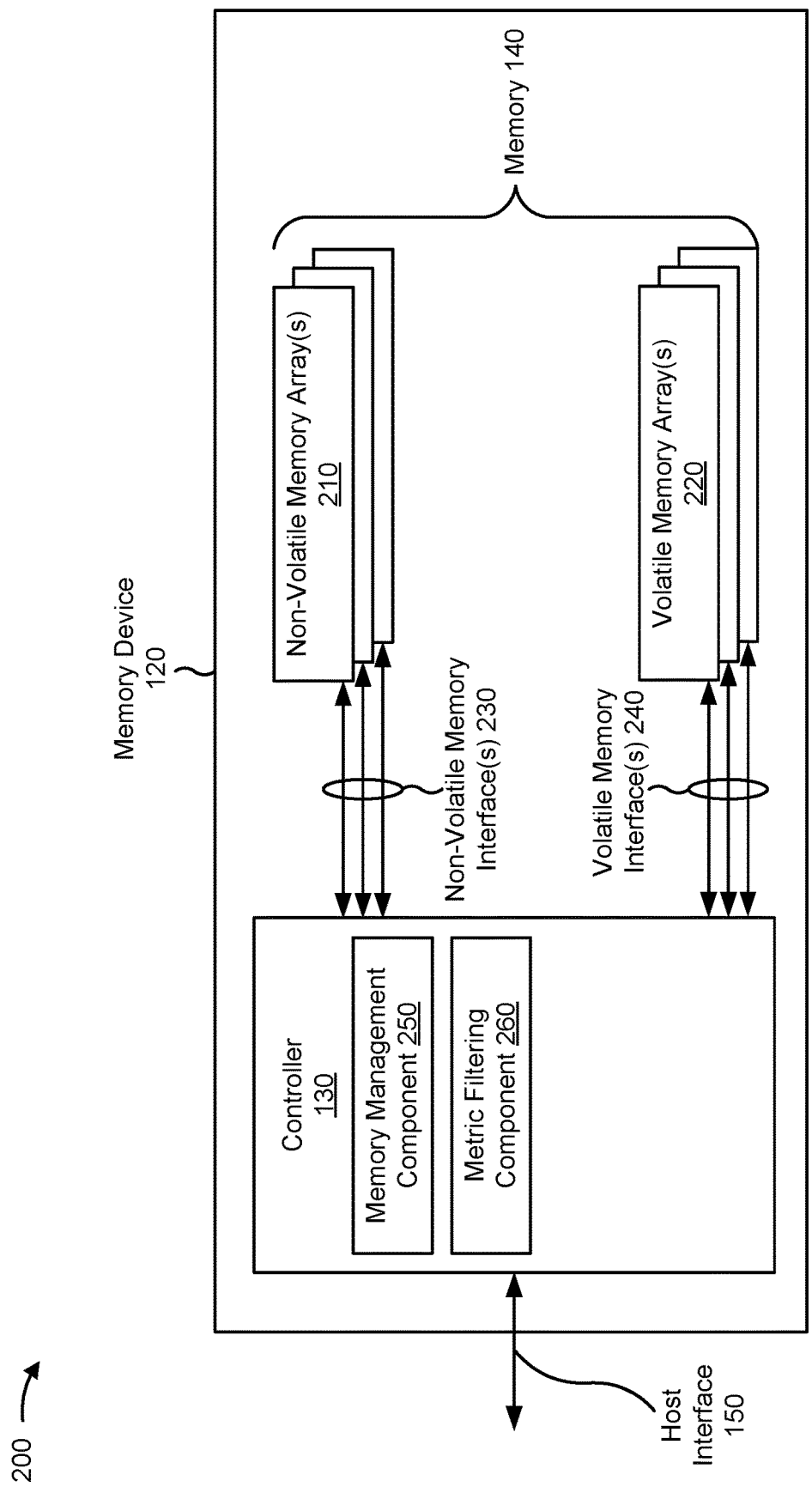
FIG. 2 is a diagram of example components included in a memory device.

FIG. 2 is a diagram of example components 200 included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, and/or a metric filtering component 260. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The metric filtering component 260 may be configured to obtain a metric associated with the memory 140 using a memory read configuration; filter, using a low pass filter, the metric associated with the memory 140 to obtain a filtered metric; and evaluate, using a memory management process, a read-write reliability of the memory 140 based on the filtered metric.

The metric filtering component 260 may be configured to obtain a first metric associated with a memory 140 of the memory device 120 using a first memory read configuration; apply a function to the first metric to obtain a second memory read configuration; obtain a second metric associated with the memory 140 using the second memory read configuration; filter, using a filter function, the first metric and the second metric to obtain a first filtered metric and a second filtered metric; provide the first filtered metric and the second filtered metric to a memory management process executing on the controller 130; and perform an action based on an output of the memory management process, wherein the output is based on the first filtered metric and the second filtered metric.

The metric filtering component 260 may be configured to obtain a metric associated with a memory 140 using a memory read configuration; filter, using a low pass filter, the metric associated with the memory 140 to obtain a filtered metric; provide the filtered metric to a memory management process; and perform an action based on an output of the memory management process, wherein the output is based on the filtered metric.

Figure 3:
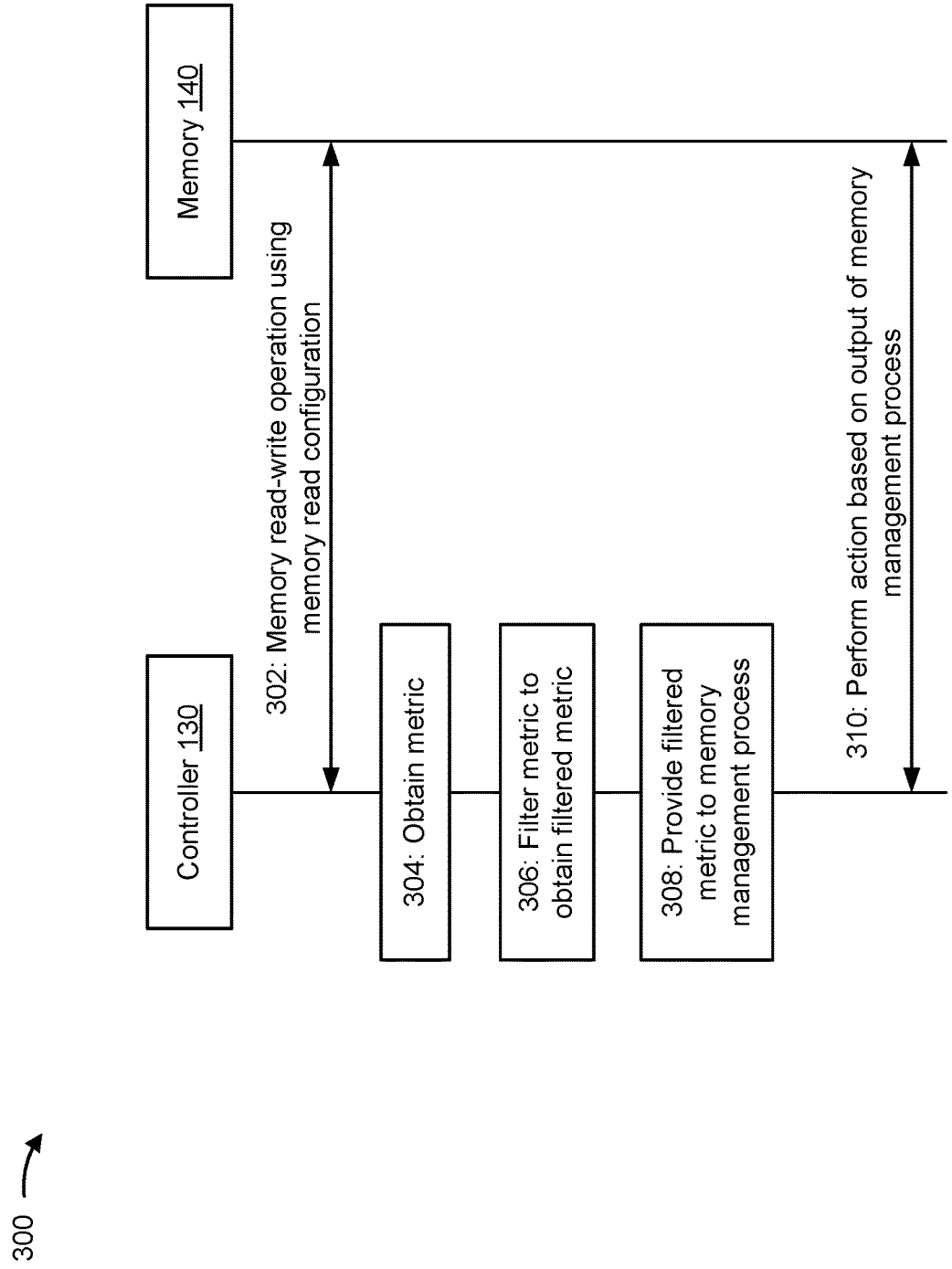
FIG. 3 is a diagram illustrating an example associated with filtering metrics associated with memory.
Figure 4:
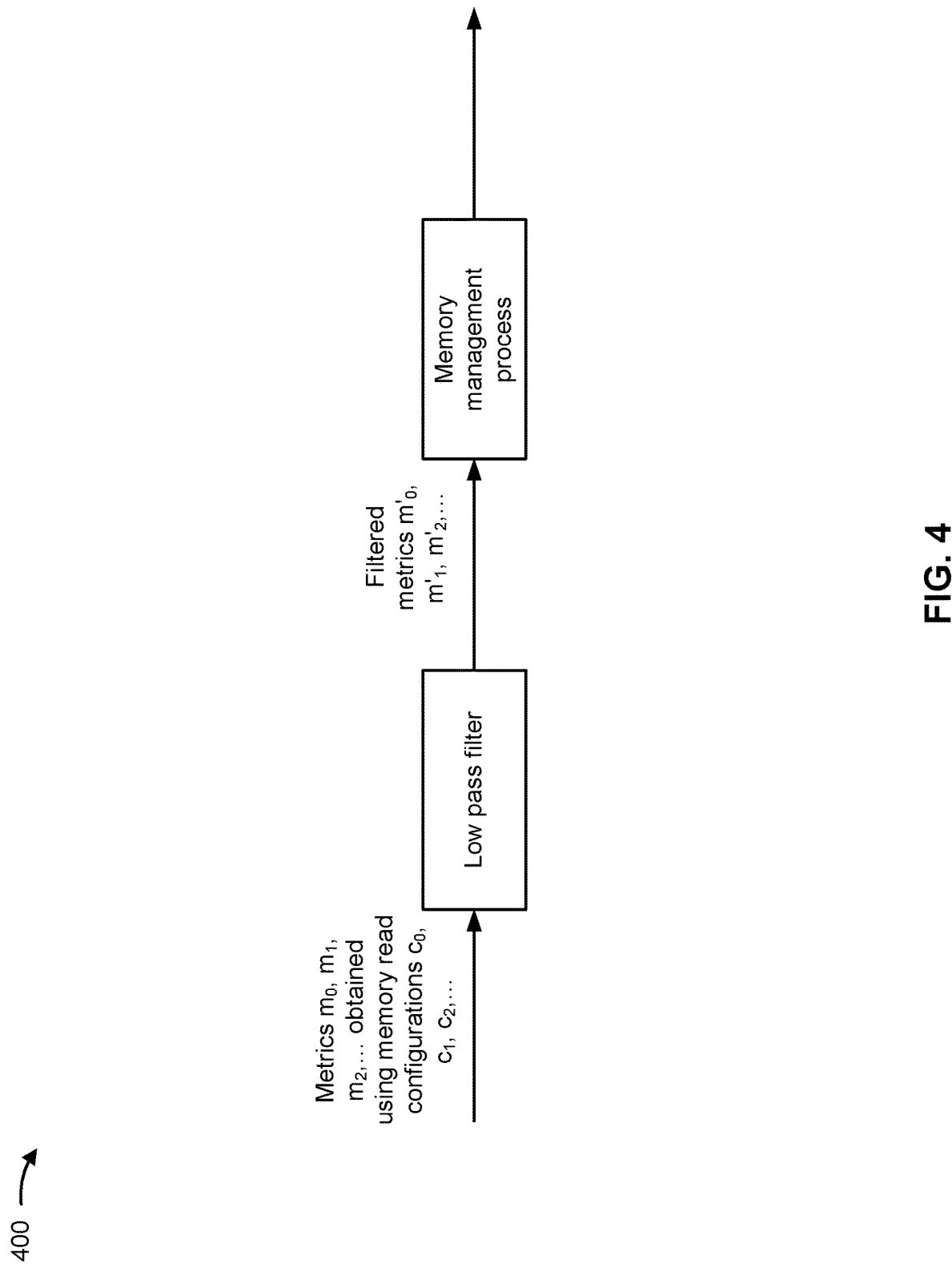
FIG. 4 is a diagram illustrating an example associated with filtering metrics associated with memory.
Figure 5:
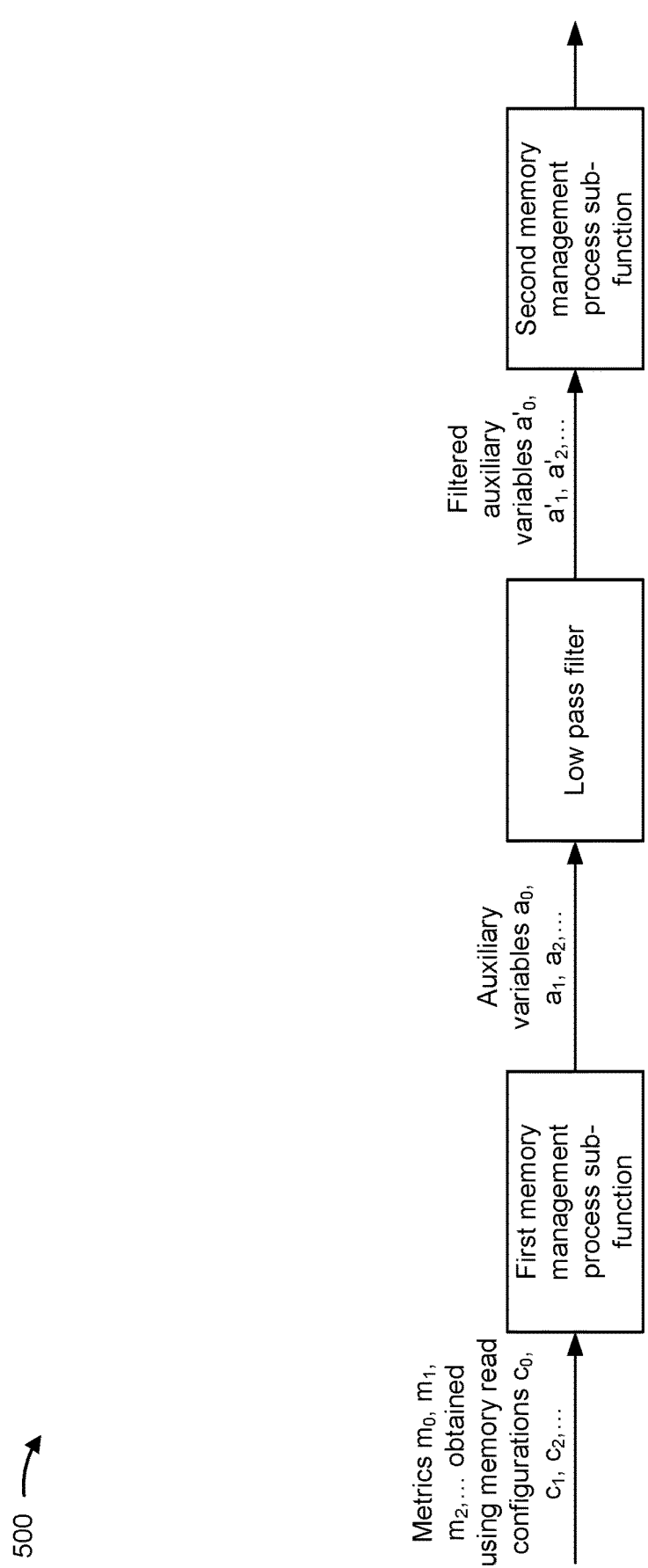
FIG. 5 is a diagram illustrating an example associated with filtering auxiliary variables associated with memory.
Figure 7:
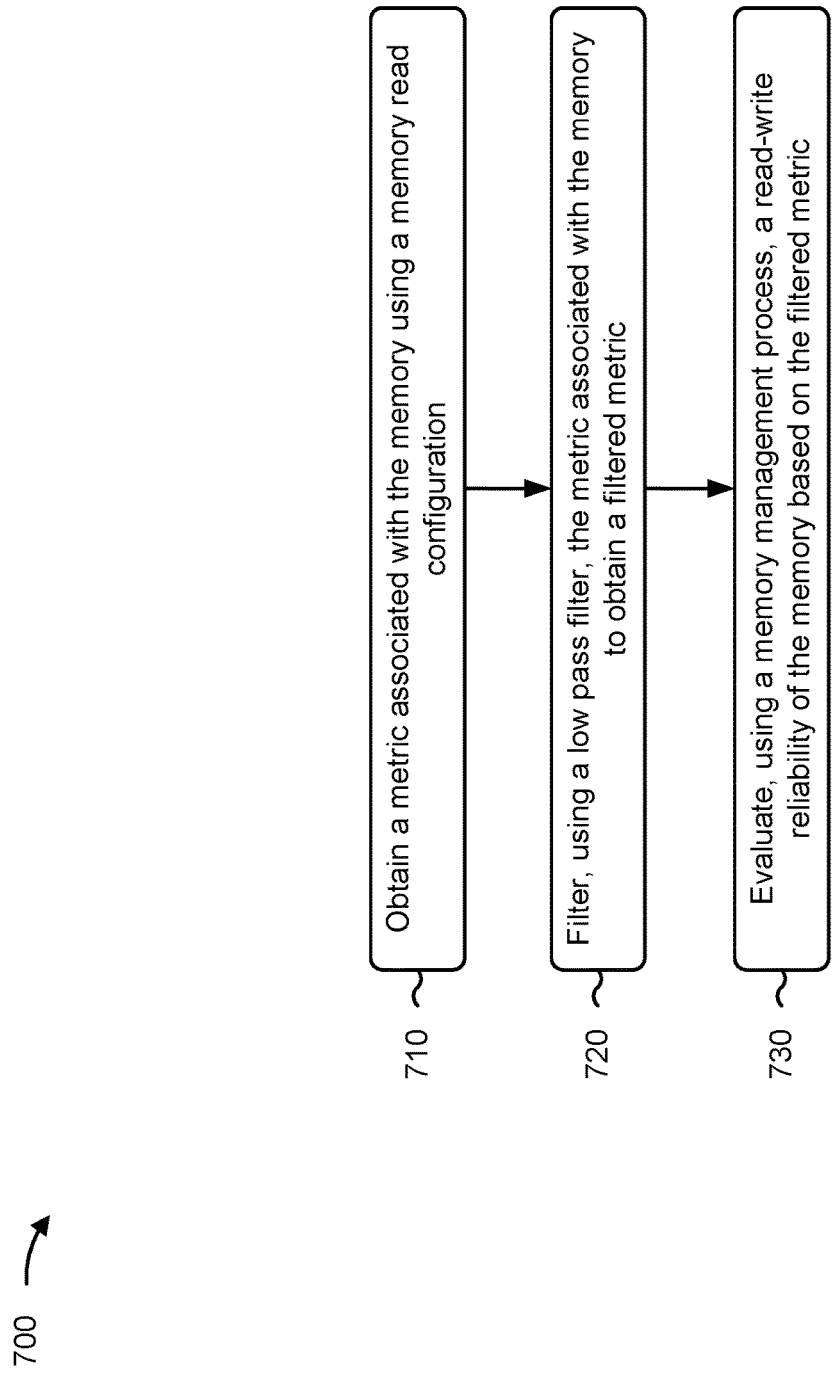
FIGS. 7-9 are flowcharts of example methods associated with filtering metrics associated with memory.
Figure 8:
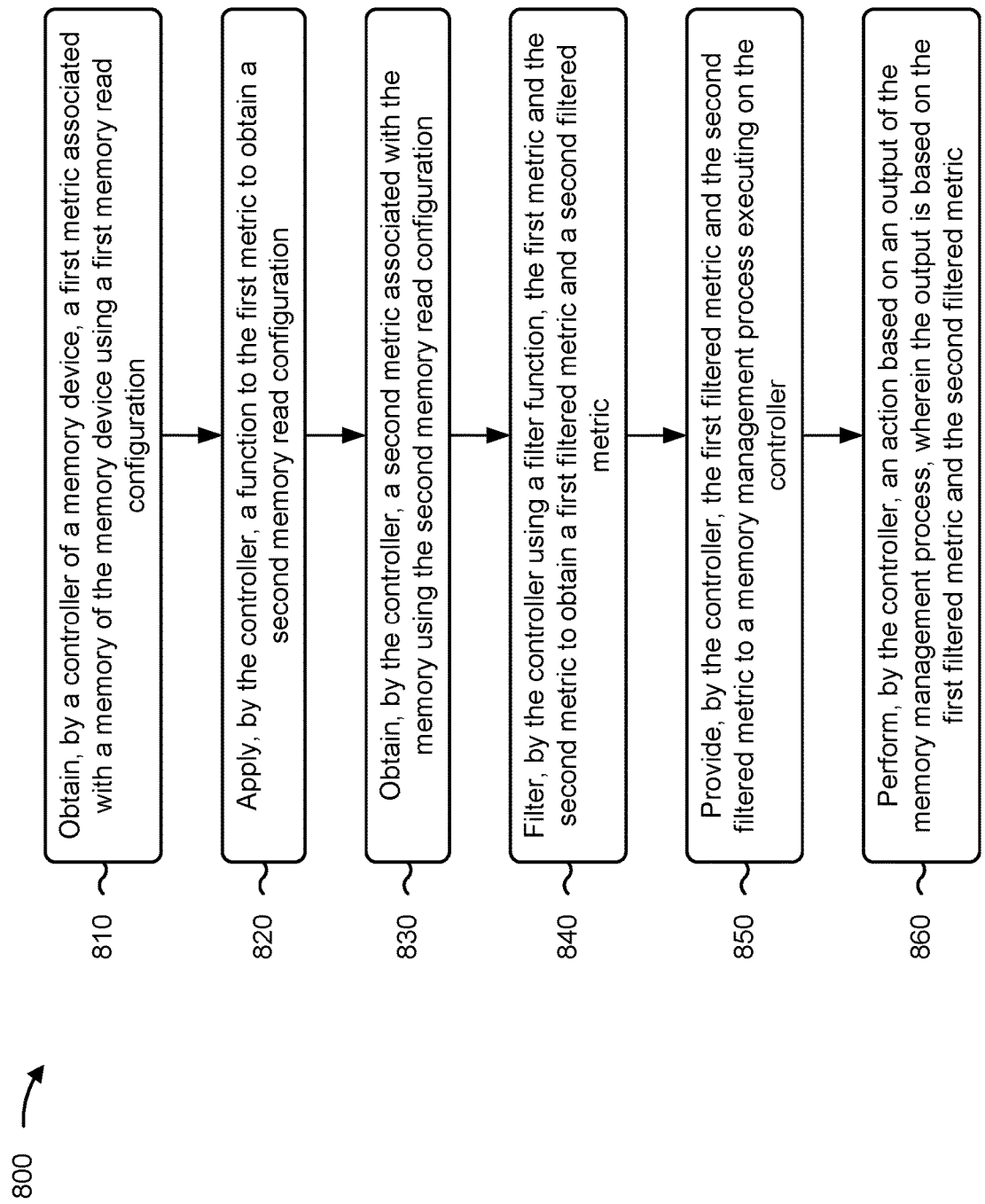
Figure 9:
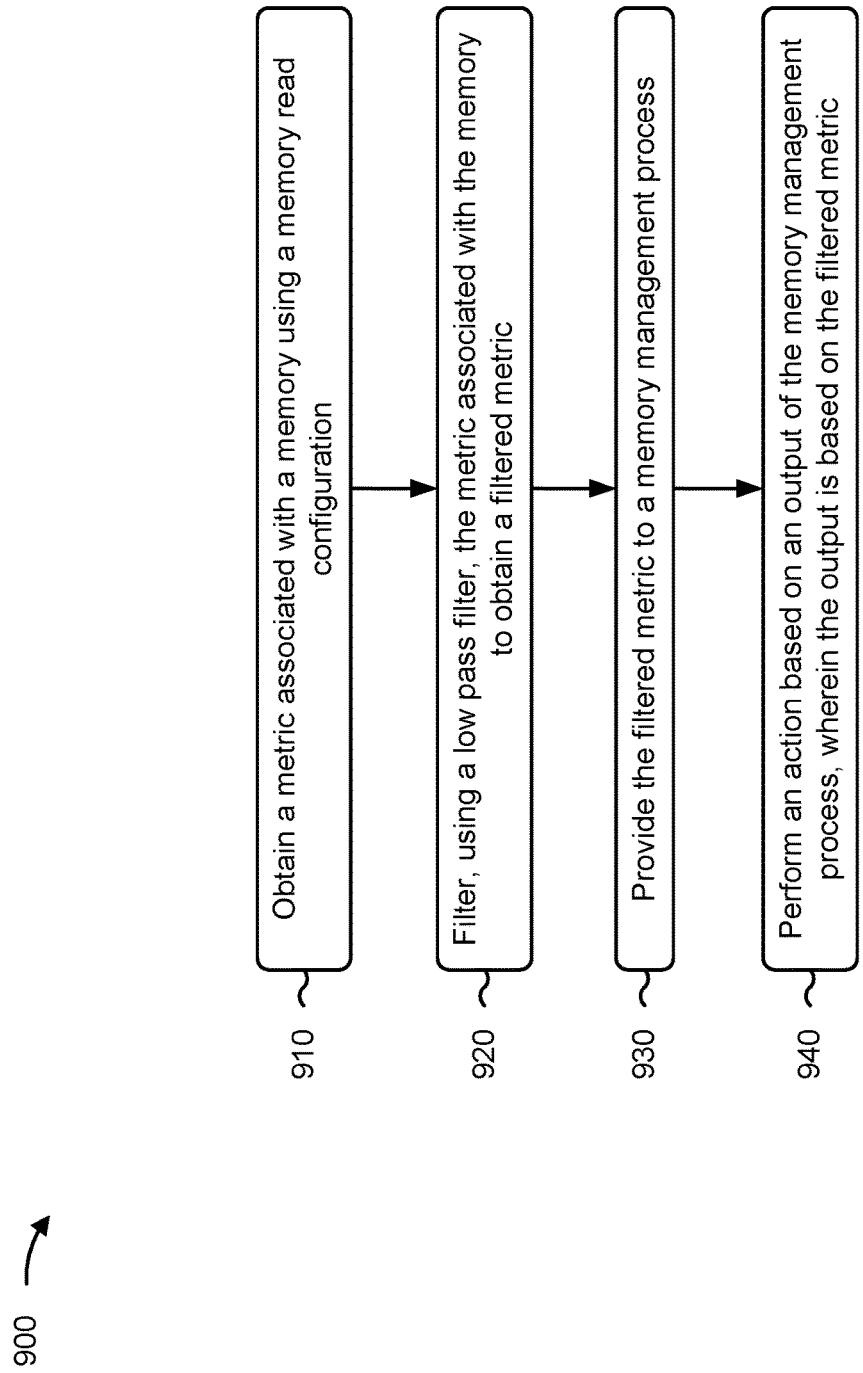

One or more devices or components shown in FIG. 2 may be used to carry out operations described elsewhere herein, such as one or more operations of FIGS. 3-5 and/or 6A-6D and/or one or more process blocks of the methods of FIGS. 7-9. For example, the controller 130 and/or the metric filtering component 260 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

FIG. 3 is a diagram illustrating an example 300 associated with filtering metrics associated with memory. As shown in FIG. 3, example 300 includes a controller (e.g., controller 130) and memory (e.g., memory 140). The memory may be a non-volatile memory.

In some implementations, the controller may execute a memory management process, which may serve to assess a read-write reliability associated with the memory. The memory management process may ensure that the read-write reliability associated with the memory satisfies a threshold (e.g., less than X read-write errors per Y read-write operations). The controller may continuously run the memory management process as a background process to ensure the read-write reliability associated with the memory.

As shown by reference number 302, the controller may perform a memory read-write operation using a memory read configuration, which may be triggered by the memory management process. In other words, the memory management process that executes on the controller may cause the controller to perform the memory read-write operation using the memory read configuration. The memory read-write operation may be a memory read operation and/or a memory write operation. The memory read configuration may include various parameters associated with performing the memory read-write operation. The controller may write data to the memory and/or read data from the memory based on the memory read-write operation.

As shown by reference number 304, the controller may obtain a metric associated with the memory using the memory read configuration, which may be triggered by the memory management process. In other words, the memory management process that executes on the controller may cause the controller to obtain the metric associated with the memory using the memory read configuration. The controller may obtain the metric associated with the memory based on performing the read-write operation on the memory in accordance with the memory read configuration. The metric may reflect a characteristic of the memory when the memory is subjected to the read-write operation. The metric associated with the memory may be a measurement associated with the memory, where the measurement may reflect the characteristic of the memory. The metric may be a bit error count, a valley margin (in mV) (e.g., a relative margin between pairs of adjacent programming distributions), an optimal read location, or a read-to-read variation. The memory read configuration may be based on a read voltage value, and/or read operation timing parameters, such as a sensing time or a wordline voltage ramping delay.

As shown by reference number 306, the controller may filter, using a low pass filter, the metric associated with the memory to obtain a filtered metric. The controller may filter the metric to reduce (or remove) noise associated with the metric, where the noise may be due to a metric-to-metric variation, a read-to-read variation, or a measurement-to-measurement variation. The controller may filter the metric using the low pass filter. Some examples of low pass filters may include moving average filters or weighted average filters. Alternatively, other types of filters may be used for filtering the metric. The other types of filters may be non-low-pass filters. In some implementations, the controller may filter the metric using a filter function, which may include a moving average filter function or a weighted average filter function.

In some implementations, a type of low pass filter applied (or a type of filter applied) may depend on a type of metric. For example, a certain type of filter may only be applied to a certain type of metric. As another example, various possible filters may be applied to a certain type of metric. In some implementations, different types of low pass filters may be associated with different sets of parameters, which may influence an amount of noise or variation that is able to be removed from the metric. The different sets of parameters may include predefined parameters and/or parameters that are adjustable by a user.

As shown by reference number 308, the controller may provide the filtered metric to the memory management process. The controller may evaluate, using the memory management process, the read-write reliability of the memory based on the filtered metric. The controller may determine, via the memory management process, whether the read-write reliability of the memory satisfies the threshold, which may be based on the filtered metric. By using the filtered metric, as opposed to an unfiltered metric (e.g., the metric originally obtained based on the memory read configuration), an evaluation of the read-write reliability may be more accurate. The memory management process may generate an output, which may be based on the filtered metric. The output may indicate a level of read-write reliability associated with the memory.

As shown by reference number 310, the controller may perform an action based on the output of the memory management process. The controller may perform the action based on the read-write reliability of the memory not satisfying the threshold. As an example, the action may include adjusting a read level associated with the memory. As another example, the action may include shutting down a portion of the memory based on a risk of data loss associated with the portion of the memory satisfying a threshold. The controller may determine which action to perform depending on the output of the memory management process. The controller may select the action from a list of possible actions, depending on the output of the memory management process. Other examples of actions may involve relocating data and freeing up memory for new data, adding extra protection to the data by encoding with extra parity, and/or storing information regarding optimal read levels for particular memory locations.

In some implementations, the metric may be one of a plurality of metrics, where each metric of the plurality of metrics may be associated with a different memory read configuration. The controller may perform multiple read-write operations using multiple memory read configurations, respectively, and the controller may obtain the plurality of metrics associated with the memory using the multiple memory read configurations. The controller may apply the low pass filter to each of the plurality of metrics, which may reduce noise associated with the plurality of metrics. In other words, the controller may filter the plurality of metrics using the low pass filter to reduce a read-to-read variation (or measurement-to-measurement variation) associated with the plurality of metrics.

In some implementations, the plurality of metrics and the multiple memory read configurations may be derived based on each other. For example, the controller may obtain a first metric associated with the memory using a first memory read configuration. The controller may apply a function to the first metric to obtain a second memory read configuration. The controller may obtain a second metric associated with the memory using the second memory read configuration. When performing the filtering, the controller may filter both the first metric and the second metric. The controller may filter the first metric and the second metric using a same set of filtering parameters, or alternatively, the controller may filter the first metric and the second metric using different sets of filtering parameters.

In some implementations, the controller may provide the metric associated with the memory to a first memory management process sub-function of the memory management process to obtain an auxiliary variable associated with the memory. The controller may filter, using the low pass filter, the auxiliary variable associated with the memory to obtain a filtered auxiliary variable. The controller may provide the filtered auxiliary variable to a second memory management process sub-function of the memory management process. In other words, the controller may evaluate, using the second memory management process sub-function of the memory management process, the read-write reliability of the memory based on the filtered auxiliary variable.

As indicated above, FIG. 3 is provided as an example. Other examples may differ from what is described with regard to FIG. 3.

FIG. 4 is a diagram illustrating an example 400 associated with filtering metrics associated with memory.

As shown in FIG. 4, a controller may provide metrics (e.g., $m_0, m_1, m_2, \ldots$) obtained using memory read configurations (e.g., $c_0, c_1, c_2, \ldots$) to a low pass filter, which may output filtered metrics (e.g., $m'_0, m'_1, m'_2, \ldots$). The filtered metrics may be provided to a memory management process that executes on the controller. In order to mitigate a read-to-read variation, the low pass filter may be applied to the metrics measured from a memory (e.g., a NAND). Instead of feeding the metrics directly to the memory management process, the metrics may be sent through the low pass filter, and then results of the low pass filter (e.g., the filtered metrics) may be fed to the memory management process. As a result, the lower noise associated with the filtered metrics received by the memory management process may improve an effectiveness of the memory management process.

As indicated above, FIG. 4 is provided as an example. Other examples may differ from what is described with regard to FIG. 4.

FIG. 5 is a diagram illustrating an example 500 associated with filtering auxiliary variables associated with memory.

As shown in FIG. 5, a controller may provide metrics (e.g., $m_0, m_1, m_2, \ldots$) obtained using memory read configurations (e.g., $c_0, c_1, c_2, \ldots$) to a first memory management process sub-function of a memory management process. The first memory management process sub-function may determine auxiliary variables (e.g., $a_0, a_1, a_2, \ldots$) based on the metrics. The auxiliary variables may be provided to a low pass filter, which may output filtered auxiliary variables (e.g., $a'_0, a'_1, a'_2, \ldots$). The filtered auxiliary variables may be provided to a second memory management process sub-function of the memory management process, and so on. In this case, the low pass filter may be applied on the auxiliary variables of the first memory management process sub-function, which may be derived from the metrics that were measured from a memory (e.g., a NAND). Without the low pass filter, the controller may provide metrics to the first memory management process sub-function, which may result in the auxiliary variables. However, then the auxiliary variables would be provided to the second memory management process sub-function without any low pass filtering. As a result, the auxiliary variables may be associated with noise (or measurement variation).

As indicated above, FIG. 5 is provided as an example. Other examples may differ from what is described with regard to FIG. 5.

FIGS. 6A-6D are diagrams illustrating an example 600 of a memory management process.

In some implementations, a memory management process may be for calibrating a read level. The memory management process may collect cell count values (e.g., CFBit values) at different read locations, where the cell count values may correspond to counts of non-conducting cells. The memory management process may form histogram bins using the cell count values. The histogram bins may reflect a shape of a read valley. The memory management process may search for a valley bottom based on the histogram bins. By identifying the valley bottom, the memory management process may be able to calibrate the read level (e.g., select an optimal read level that results in fewer read-write errors).

Figure 6A:
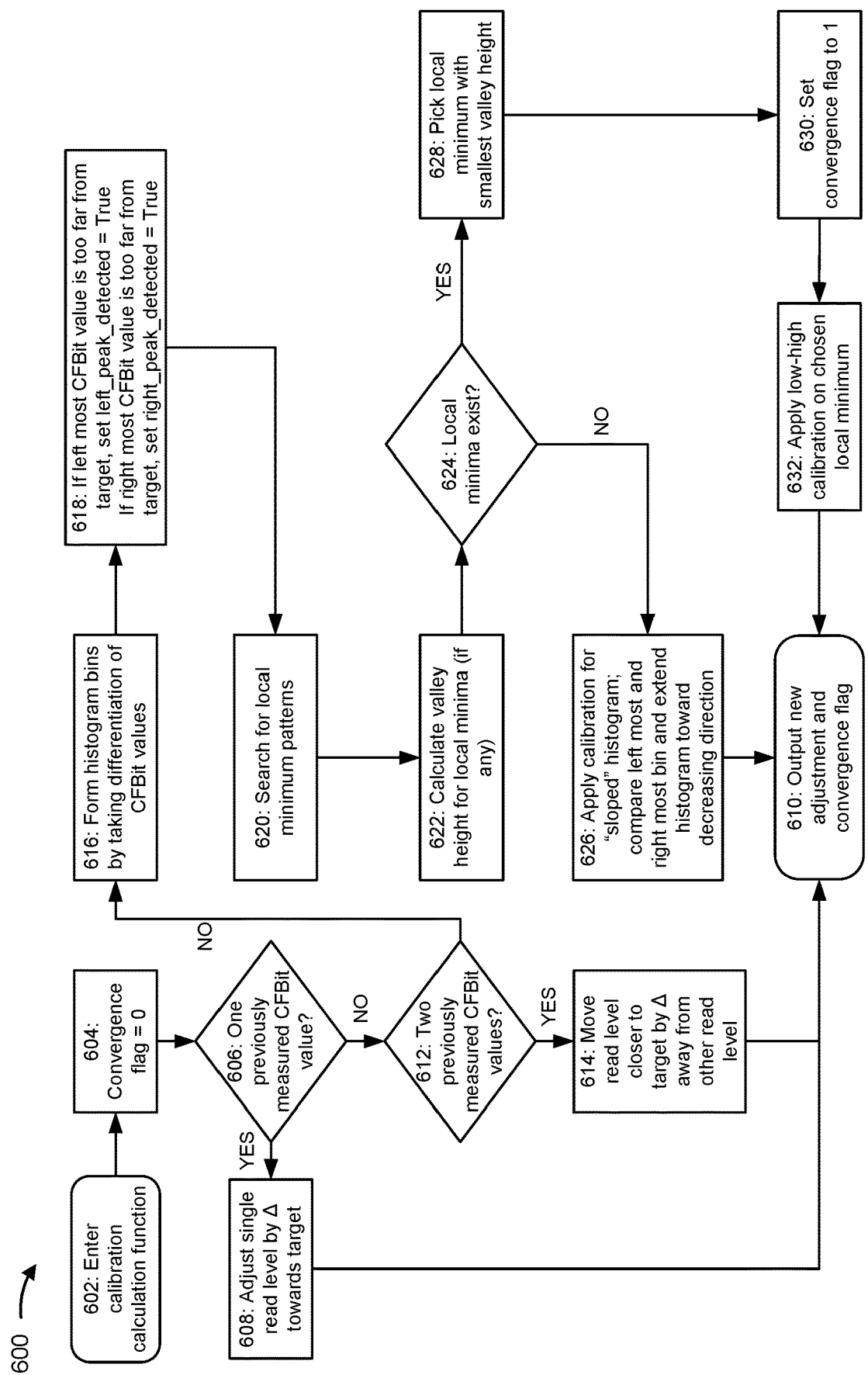
FIGS. 6A-6D are diagrams illustrating an example of a memory management process.

As shown by FIG. 6A, and by reference number 602, the memory management process may enter a calibration calculation function, which may be for calibrating the read level. As shown by reference number 604, a convergence flag may be set to zero. As shown by reference number 606, a determination may be made regarding one previously measured cell count value. As shown by reference number 608, when there is one previously measured cell count value, a read level may be adjusted by a delta value (Δ) towards a target. As shown by reference number 610, a new adjustment and convergence flag may be outputted. As shown by reference number 612, when there is not one previously measured cell count value, a determination may be made regarding two previously measured cell count values. As shown by reference number 614, when there are two previously measured cell count values, the read level may be moved closer to the target by the delta value away from another read level, and as shown by reference number 610, the new adjustment and convergence flag may be outputted.

As shown by reference number 616, when there are no two previously measured cell count values, histogram bins may be formed by taking a differentiation of the cell count values. As shown by reference number 618, when a left most cell count value is too far from the target, a "detected left peak" may be set to true. When a right most cell count value is too far away from the target, a "detected right peak" may be set to true. As shown by reference number 620, a search for local minimum patterns may be performed. As shown by reference number 622, a valley height for local minima (if any) may be calculated. As shown by reference number 624, a determination may be made regarding whether the local minima exists. As shown by reference number 626, when the local minima does not exist, a calibration may be applied for a sloped histogram. A left most and right most histogram bin may be compared, and a histogram may be extended towards a decreasing direction. As shown by reference number 610, the new adjustment and convergence flag may be outputted.

As shown by reference number 628, when the local minima does exist, a local minimum with a smallest valley height may be selected. As shown by reference number 630, the convergence flag may be set to one. As shown by reference number 632, a low-high calibration may be applied on a selected local minimum. As shown by reference number 610, the new adjustment and convergence flag may be outputted.

Figure 6B:
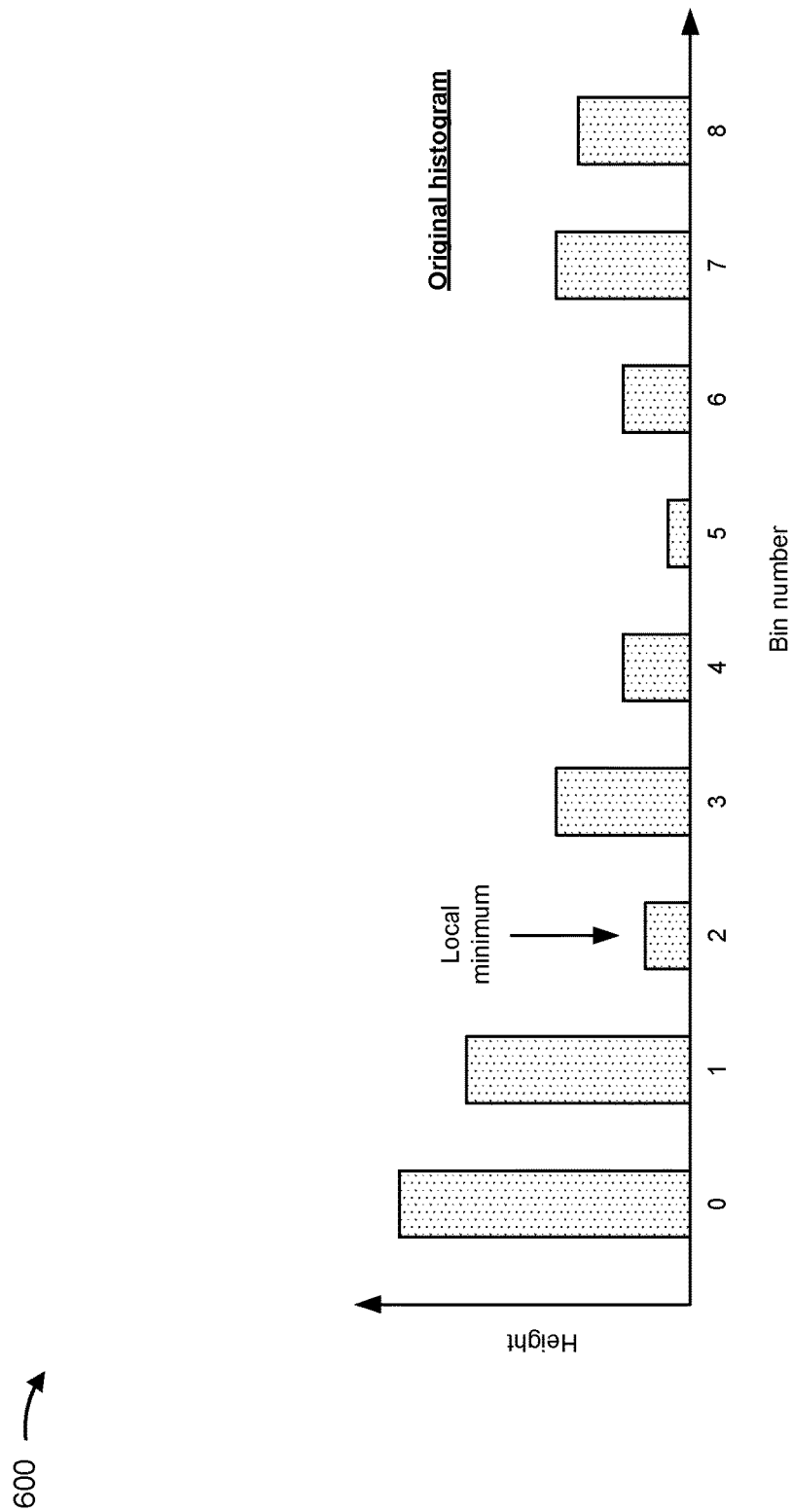

As shown by FIG. 6B, the memory management process may create a plurality of histogram bins, and may attempt to determine a valley bottom among the plurality of histogram bins. However, the memory management process may be unable to differentiate whether the valley bottom is at a second histogram bin or at a fifth histogram bin. The second histogram bin may be surrounded by two histogram bins associated with greater heights as compared to the second histogram bin. Similarly, the fifth histogram bin may be surrounded by two histogram bins associated with greater heights as compared to the fifth histogram bin. A height of the second histogram bin may actually be higher, but noise may push the height of the second histogram bin lower. As a result, the plurality of histogram bins may appear to have two minimums due to the noise.

Figure 6C:
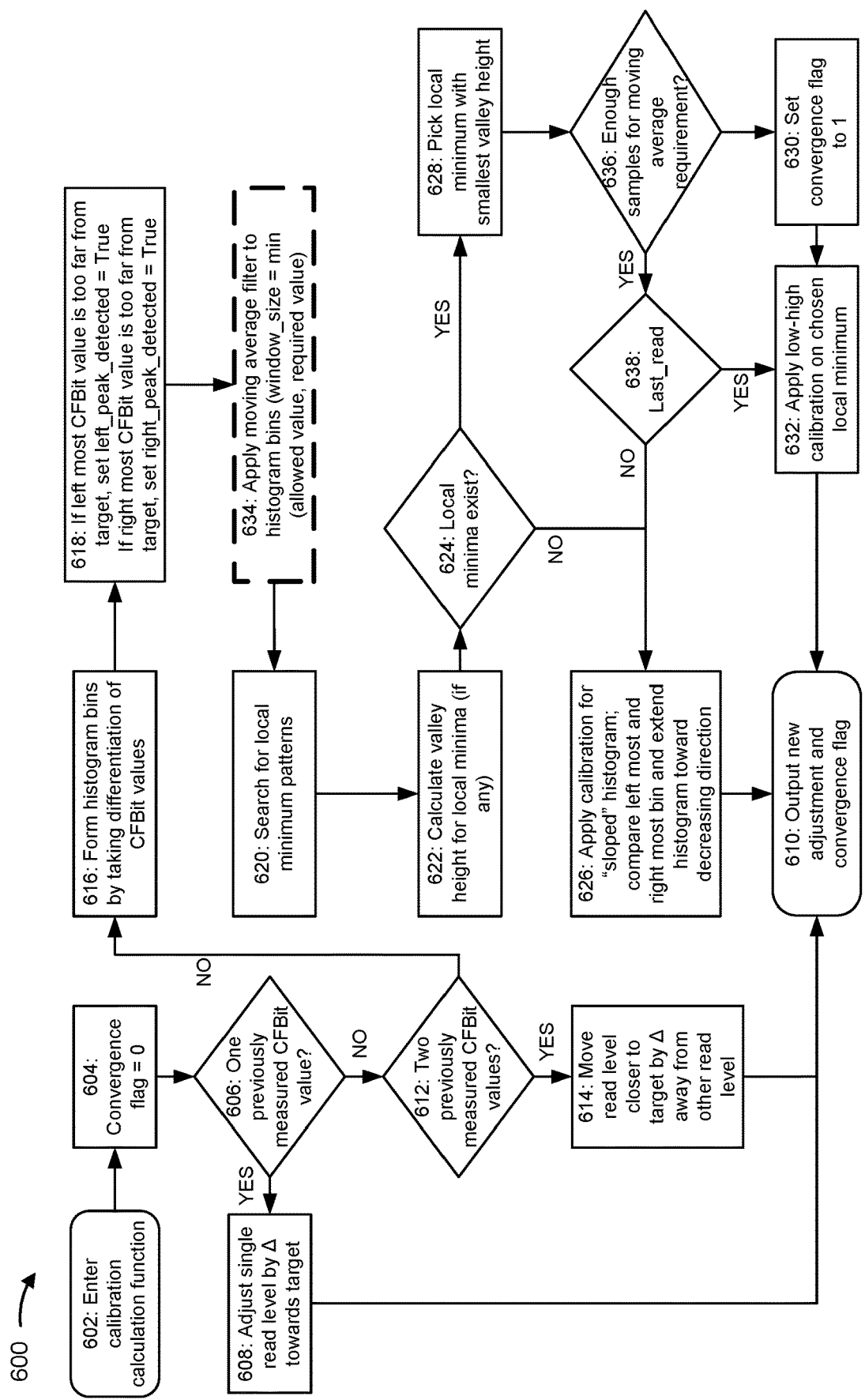

As shown by FIG. 6C, and by reference number 634, a moving average filter (e.g., a particular form of a low pass filter) may be applied to histogram bins. A window size associated with the moving average filter may be set to a minimum, and may be based on an allowed value and a required value. After the moving average filter is applied, the local minimum patterns may be searched (as shown by reference number 620), the valley height for the local minima may be calculated (as shown by reference number 622), and the determination regarding whether local minima exist may be made (as shown by reference number 624). As shown by reference number 636, a determination may be made regarding whether a sufficient number of samples are available for a moving average requirement. As shown by reference number 638, a determination may be made regarding a last read, and if so, the low-high calibration may be applied on the selected local minimum (as shown by reference number 632). Otherwise, the calibration may be applied for the sloped histogram (as shown by reference number 626).

Figure 6D:
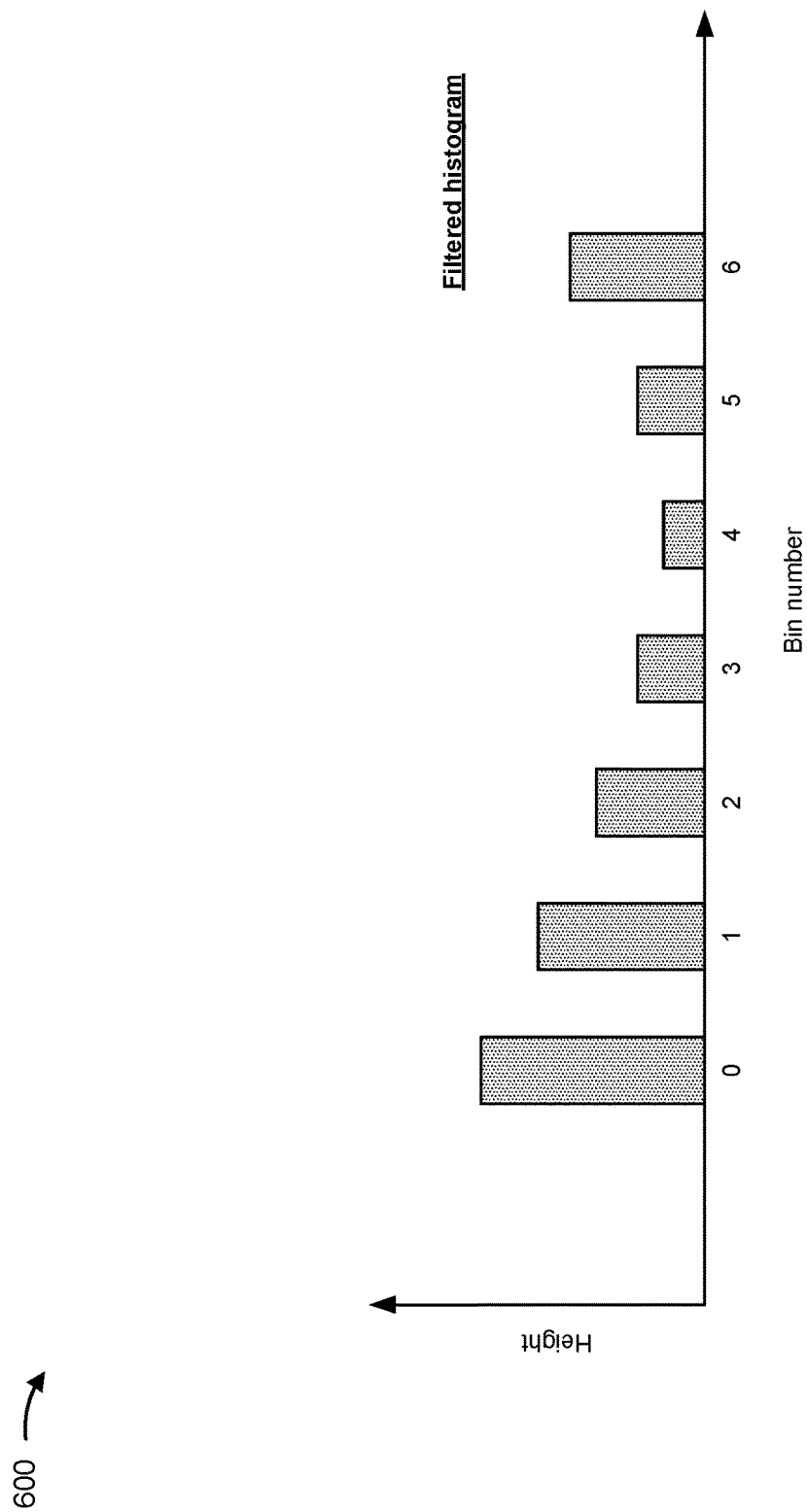

As shown by FIG. 6D, the memory management process may apply the moving average filter when creating the plurality of histogram bins. After applying the moving average filter, a wrong local minimum may be removed, and the memory management process may be able to correctly determine the location of the valley bottom. In other words, by applying the moving average filter, the noise may be removed, and an actual valley bottom may be detected. By applying the moving average filter, a single valley bottom may be detected, which may be used for correctly calibrating the read level.

In some implementations, by applying a low pass filter (e.g., the moving average filter) to metrics (e.g., histogram bins associated with cell count values), noise or errors may be removed. On the other hand, when the low pass filter is not applied to the metrics, the noise or errors (e.g., an appearance of multiple valley bottoms) may result. A type of low pass filter applied to the metrics may be dependent on a type of memory management process that is deployed.

As indicated above, FIGS. 6A-6D are provided as examples. Other examples may differ from what is described with regard to FIGS. 6A-6D.

FIG. 7 is a flowchart of an example method 700 associated with filtering metrics associated with memory. In some implementations, a memory device (e.g., memory device 120) may perform or may be configured to perform one or more process blocks of FIG. 7. Additionally, or alternatively, one or more components of the memory device (e.g., controller 130 and/or memory 140) may perform or may be configured to perform one or more process blocks of FIG. 7.

As shown in FIG. 7, the method 700 may include obtaining a metric associated with the memory using a memory read configuration (block 710). As further shown in FIG. 7, the method 700 may include filtering, using a low pass filter, the metric associated with the memory to obtain a filtered metric (block 720). As further shown in FIG. 7, the method 700 may include evaluating, using a memory management process, a read-write reliability of the memory based on the filtered metric (block 730).

Although FIG. 7 shows example blocks of a method 700, in some implementations, the method 700 may include additional blocks, fewer blocks, different blocks, or differently arranged blocks than those depicted in FIG. 7. Additionally, or alternatively, two or more of the blocks of the method 700 may be performed in parallel. The method 700 is an example of one method that may be performed by one or more devices described herein. These one or more devices may perform or may be configured to perform one or more other methods based on operations described herein, such as the operations described in connection with FIGS. 3-5 and/or 6A-6D.

FIG. 8 is a flowchart of an example method 800 associated with filtering metrics associated with memory. In some implementations, a memory device (e.g., memory device 120) may perform or may be configured to perform one or more process blocks of FIG. 8. Additionally, or alternatively, one or more components of the memory device (e.g., controller 130 and/or memory 140) may perform or may be configured to perform one or more process blocks of FIG. 8.

As shown in FIG. 8, the method 800 may include obtaining, by a controller of a memory device, a first metric associated with a memory of the memory device using a first memory read configuration (block 810). As further shown in FIG. 8, the method 800 may include applying, by the controller, a function to the first metric to obtain a second memory read configuration (block 820). As further shown in FIG. 8, the method 800 may include obtaining, by the controller, a second metric associated with the memory using the second memory read configuration (block 830). As further shown in FIG. 8, the method 800 may include filtering, by the controller using a filter function, the first metric and the second metric to obtain a first filtered metric and a second filtered metric (block 840). As further shown in FIG. 8, the method 800 may include providing, by the controller, the first filtered metric and the second filtered metric to a memory management process executing on the controller (block 850). As further shown in FIG. 8, the method 800 may include performing, by the controller, an action based on an output of the memory management process, wherein the output is based on the first filtered metric and the second filtered metric (block 860).

Although FIG. 8 shows example blocks of a method 800, in some implementations, the method 800 may include additional blocks, fewer blocks, different blocks, or differently arranged blocks than those depicted in FIG. 8. Additionally, or alternatively, two or more of the blocks of the method 800 may be performed in parallel. The method 800 is an example of one method that may be performed by one or more devices described herein. These one or more devices may perform or may be configured to perform one or more other methods based on operations described herein, such as the operations described in connection with FIGS. 3-5 and/or 6A-6D.

FIG. 9 is a flowchart of an example method 900 associated with filtering metrics associated with memory. In some implementations, a memory device (e.g., memory device 120) may perform or may be configured to perform one or more process blocks of FIG. 9. Additionally, or alternatively, one or more components of the memory device (e.g., controller 130 and/or memory 140) may perform or may be configured to perform one or more process blocks of FIG. 9.

As shown in FIG. 9, the method 900 may include obtaining a metric associated with a memory using a memory read configuration (block 910). As further shown in FIG. 9, the method 900 may include filtering, using a low pass filter, the metric associated with the memory to obtain a filtered metric (block 920). As further shown in FIG. 9, the method 900 may include providing the filtered metric to a memory management process (block 930). As further shown in FIG. 9, the method 900 may include performing an action based on an output of the memory management process, wherein the output is based on the filtered metric (block 940).

Although FIG. 9 shows example blocks of a method 900, in some implementations, the method 900 may include additional blocks, fewer blocks, different blocks, or differently arranged blocks than those depicted in FIG. 9. Additionally, or alternatively, two or more of the blocks of the method 900 may be performed in parallel. The method 900 is an example of one method that may be performed by one or more devices described herein. These one or more devices may perform or may be configured to perform one or more other methods based on operations described herein, such as the operations described in connection with FIGS. 3-5 and/or 6A-6D.

In some implementations, a memory device includes memory; and a controller configured to: obtain a metric associated with the memory using a memory read configuration; filter, using a low pass filter, the metric associated with the memory to obtain a filtered metric; and evaluate, using a memory management process, a read-write reliability of the memory based on the filtered metric.

In some implementations, a method includes obtaining, by a controller of a memory device, a first metric associated with a memory of the memory device using a first memory read configuration; applying, by the controller, a function to the first metric to obtain a second memory read configuration; obtaining, by the controller, a second metric associated with the memory using the second memory read configuration; filtering, by the controller using a filter function, the first metric and the second metric to obtain a first filtered metric and a second filtered metric; providing, by the controller, the first filtered metric and the second filtered metric to a memory management process executing on the controller; and performing, by the controller, an action based on an output of the memory management process, wherein the output is based on the first filtered metric and the second filtered metric.

In some implementations, a system includes means for obtaining a metric associated with a memory using a memory read configuration; means for filtering, using a low pass filter, the metric associated with the memory to obtain a filtered metric; means for providing the filtered metric to a memory management process; and means for performing an action based on an output of the memory management process, wherein the output is based on the filtered metric.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   memory; and
   a controller configured to:
   obtain a metric associated with the memory using a memory read configuration, wherein the metric reflects a characteristic of the memory when the memory is subjected to a read-write operation performed on the memory using the memory read configuration;
   filter, using a low pass filter, the metric associated with the memory to obtain a filtered metric;
   evaluate, using a memory management process, a read-write reliability of the memory based on the filtered metric; and
   perform an action based on an output of the memory management process, wherein the action includes shutting down a page of the memory based on a risk of data loss associated with the page of the memory satisfying an error threshold.

2. The memory device of claim 1, wherein the action includes adjusting a read level associated with the memory.

3. The memory device of claim 1, wherein the metric is one of a plurality of metrics, wherein each metric of the plurality of metrics is associated with a different memory read configuration, and wherein filtering the plurality of metrics using the low pass filter reduces noise associated with the plurality of metrics.

4. The memory device of claim 1, wherein the memory management process includes a first memory management process sub-function and a second memory management process sub-function, and wherein the controller is configured to:
   provide the metric associated with the memory to the first memory management process sub-function to obtain an auxiliary variable associated with the memory;
   filter, using the low pass filter, the auxiliary variable associated with the memory to obtain a filtered auxiliary variable; and
   evaluate, using the second memory management process sub-function, the read-write reliability of the memory based on the filtered auxiliary variable.

5. The memory device of claim 1, wherein the low pass filter is a moving average filter.

6. The memory device of claim 1, wherein the low pass filter is a weighted average filter.

7. The memory device of claim 1, wherein the controller is configured to:
   obtain a plurality of metrics associated with the memory using the memory read configuration; and
   filter the plurality of metrics using the low pass filter to reduce a read-to-read metric variation associated with the plurality of metrics.

8. The memory device of claim 1, wherein the memory is a non-volatile memory.

9. A method, comprising:
   obtaining, by a controller of a memory device, a first metric associated with a memory of the memory device using a first memory read configuration, wherein the first metric reflects a first characteristic of the memory when the memory is subjected to a first read-write operation performed on the memory using the first memory read configuration;
   applying, by the controller, a function to the first metric to obtain a second memory read configuration;
   obtaining, by the controller, a second metric associated with the memory using the second memory read configuration, wherein the second metric reflects a second characteristic of the memory when the memory is subjected to a second read-write operation performed on the memory using the second memory read configuration;
   filtering, by the controller using a filter function, the first metric and the second metric to obtain a first filtered metric and a second filtered metric;
   providing, by the controller, the first filtered metric and the second filtered metric to a memory management process executing on the controller; and
   performing, by the controller, an action based on an output of the memory management process, wherein the output is based on the first filtered metric and the second filtered metric, and wherein performing the action comprises shutting down a page of the memory based on a risk of data loss associated with the page of the memory satisfying an error threshold.

10. The method of claim 9, wherein performing the action comprises adjusting a read level associated with the memory.

11. The method of claim 9, wherein filtering the first metric and the second metric using the filter function mitigates a measurement variation associated with the first metric and the second metric.

12. The method of claim 9, wherein the filter function is a moving average filter function.

13. The method of claim 9, wherein the filter function is a weighted average filter function.

14. The method of claim 9, wherein the memory is a non-volatile memory.

15. The method of claim 9, wherein filtering the first metric and the second metric comprises:
filtering the first metric and the second metric using a same set of filtering parameters.

16. The method of claim 9, wherein filtering the first metric and the second metric comprises:
filtering the first metric and the second metric using different sets of filtering parameters.

17. A system, comprising:
means for obtaining a metric associated with a memory using a memory read configuration wherein the metric reflects a characteristic of the memory when the memory is subjected to a read-write operation performed on the memory using the memory read configuration;
means for filtering, using a low pass filter, the metric associated with the memory to obtain a filtered metric;
means for providing the filtered metric to a memory management process; and
means for performing an action based on an output of the memory management process, wherein the output is based on the filtered metric, and wherein the means for performing the action comprise means for shutting down a page of the memory based on a risk of data loss associated with the page of the memory satisfying an error threshold.

18. The system of claim 17,
wherein the means for performing the action comprise means for adjusting a read level associated with the memory.

19. The system of claim 17, wherein the metric is one of a plurality of metrics, wherein each metric of the plurality of metrics is associated with a different memory read configuration, and wherein the plurality of metrics are filtered using the low pass filter to reduce noise associated with the plurality of metrics.

20. The system of claim 17, wherein the memory management process includes a first memory management process sub-function and a second memory management process sub-function, the system further comprising:
means for providing the metric associated with the memory to the first memory management process sub-function to obtain an auxiliary variable associated with the memory;
means for filtering, using the low pass filter, the auxiliary variable associated with the memory to obtain a filtered auxiliary variable; and
means for providing the filtered auxiliary variable to the second memory management process sub-function.

21. The system of claim 20, further comprising:
means for evaluating, using the second memory management process sub-function, a read-write reliability of the memory based on the filtered auxiliary variable.

22. The system of claim 17, wherein the low pass filter is a moving average filter.

23. The system of claim 17, wherein the low pass filter is a weighted average filter.

24. The system of claim 17, further comprising:
means for obtaining a plurality of metrics associated with the memory using the memory read configuration; and
means for filtering the plurality of metrics using the low pass filter to reduce a read-to-read metric variation associated with the plurality of metrics.

25. The system of claim 17, wherein the memory is a non-volatile memory.

* * * * *